United States Patent [19]

Harker et al.

[11] Patent Number: 4,616,363
[45] Date of Patent: Oct. 7, 1986

[54] ELECTRON-BEAM FURNACE WITH MAGNETIC STABILIZATION

[75] Inventors: Howard R. Harker, Malvern; Joseph A. Knecht, II, Morgantown, both of Pa.

[73] Assignee: A. Johnson Metals Corporation, Exton, Pa.

[21] Appl. No.: 737,026

[22] Filed: May 22, 1985

[51] Int. Cl.⁴ .................................. H01J 37/305
[52] U.S. Cl. .................................................. 373/14
[58] Field of Search ............................ 373/10–14; 164/506, 512, 415; 266/200

[56] References Cited

U.S. PATENT DOCUMENTS

| | | | |
|---|---|---|---|
| 3,080,626 | 3/1963 | Hanks | 373/14 X |
| 3,087,211 | 4/1963 | Howe | 373/14 X |
| 3,105,275 | 10/1963 | Hanks | 373/14 X |
| 3,189,953 | 6/1965 | Smith, Jr. | 373/14 X |
| 3,592,955 | 7/1971 | Hanks | 373/14 |

Primary Examiner—Roy N. Envall, Jr.
Attorney, Agent, or Firm—Brumbaugh, Graves, Donohue & Raymond

[57] ABSTRACT

An electron-beam furnace for melting and refining metals in a trough-like hearth by scanning high-intensity, narrow electron beams across the hearth is provided with a wire coil located near the hearth for producing a relatively weak magnetic field in the vicinity of the molten metal in the hearth to prevent erratic local beam deflections caused by fluctuations in the plasma that forms in the vicinity of the molten metal. The use of the weak magnetic field allows the electron beams projected by remotely positioned electron guns to be accurately scanned across the hearth by deflection yokes associated with the electron guns.

5 Claims, 3 Drawing Figures

ELECTRON-BEAM FURNACE WITH MAGNETIC STABILIZATION

BACKGROUND OF THE INVENTION

The present invention relates to electron-beam furnaces for melting materials by electron bombardment in a high vacuum ambient and, more particularly, to electron-beam furnaces in which the material is melted and refined in a large-area, trough-shaped hearth scanned by one or more high-intensity, narrow electron-beams projected by remotely positioned electron guns.

Electron-beam furnaces are known in the art and are used for melting materials, primarily metals, to cast ingots therefrom. By using such furnaces, ingots of exceptionally high purity may be obtained, owing primarily to effective outgassing and vaporizing of impurities in the material during the melting process.

In general, an electron-beam furnace includes a vacuum chamber enclosing a crucible or mold, at least one electron gun providing an energetic beam of electrons, means for directing the beam at the material to be melted (melt stock) and means for feeding the melt stock into the beam. The material thus melted is received by the crucible where it cools and solidifies into an ingot. During typical operation of such furnaces, the ingot is progressively drawn from the bottom of the crucible while the melt stock is being continuously fed into the beam.

Owing to the presence of impurities in the melt stock, bombardment of the melt stock by the electron-beam normally causes the release of substantial quantities of gaseous and vaporized impurities, frequently in violent bursts at random intervals. In addition to such evolved gaseous matter, there is also the splattering of molten material caused by the release of the gaseous matter in violent bursts. Therefore, it is generally desirable to position the electron gun of the furnace at a relatively large distance away from the region of electron bombardment and out of the way of the evolving gaseous matter and the splattering molten material. In this manner, damage to the electron gun caused by the condensation of the gaseous matter and the collection of molten material on the gun is avoided.

In prior art electron-beam furnaces, such as those described in U.S. Pat. Nos. 3,189,953; 3,105,275; 3,080,626; and 3,087,211, a remotely positioned, relatively large annular electron gun is used for providing a conelike electron-beam. The beam is focussed and guided into the opening of the crucible by a relatively strong magnetic field produced by one or more coils. The coils are positioned coaxially with respect to the crucible, with one coil wound around the crucible itself. Since the electron-beam tends to converge in regions of high magnetic flux density, the magnetic field used in prior art furnaces concentrates and directs a broad beam generally into the crucible in the direction of its axis but permits no scanning motion of the beam.

For casting ingots of very high purity, it is highly advantageous to provide the furnace with a large-area, trough-shaped hearth in which to melt the material. The use of such a hearth results in the exposure of a larger surface area of the molten material to the vacuum ambient, and therefore provides more effective refining of the impurities from the material through outgassing or vaporization. The hearth is typically provided with a pouring spout, from which molten material may flow into an appropriately situated crucible.

The magnetic beam guidance systems of prior art electron-beam furnaces are not suitable for use in a furnace having a hearth, because such systems are generally not capable of providing an electron-beam having a sufficiently large cross-sectional area to cover the entire hearth and crucible. However, the material in the hearth and crucible may be heated by scanning the hearth and crucible with one or more high-intensity, relatively narrow electron-beams provided by separate, remotely positioned electron guns, each having its own deflection system for sweeping the beam across the hearth and crucible in a desired manner.

When melting most metals in the hearth, the scanning of the electron-beams across the hearth and crucible may be accurately controlled by deflection systems at the remotely positioned electron guns without difficulty. It has been found, however, that during the melting of certain metals, such as alumino-thermically reduced columbium (Niobium) or zircaloy-2, the beams cannot be accurately scanned over the hearth and crucible, owing to the tendency of the beams to deviate erratically from their intended targets. Such erratic beam behavior may be caused by charge fluctuations in a plasma formed in the vicinity of the hearth and the crucible when the gaseous matter evolving from the electron bombarded metal is ionized by the electron-beams. Such charge fluctuations can cause random local deflections of the electron-beams as they pass through the plasma. Since the problem of erratic beam behavior makes the heating of the material in the hearth and crucible difficult to control, a need exists for an electron-beam furnace configuration which provides for stabilization of electron-beams projected from remotely positioned electron guns so as to permit accurate control of the scanning of each beam by the deflection system of its respective gun.

SUMMARY OF THE INVENTION

The foregoing and other disadvantages of the prior art are overcome, in accordance with the present invention, by the provision of an electron gun having a remotely controlled deflection system and means for producing a relatively weak magnetic field adjacent the material in the hearth and the crucible. The strength of the magnetic field produced is insufficient to significantly alter the trajectories of the electron-beams impinging on the hearth and crucible, but is sufficient to substantially eliminate the erratic beam behavior and thereby allow accurate control of the scanning of each beam from its electron gun.

According to the preferred embodiment of the invention, the electron-beam furnace comprises a vacuum chamber housing a trough-shaped hearth for holding material to be melted and having a spout therein for issuing a flow of molten material, a crucible positioned to receive molten material flowing from the hearth, one or more remotely positioned electron guns each having an associated beam deflection system beam across the hearth and crucible, and a wire coil wound around magnetic shunts surrounding the hearth and crucible for producing the relatively weak magnetic field adjacent to the material in the hearth.

BRIEF DESCRIPTION OF THE DRAWING

The present invention may be better understood with reference to the following detailed description of the preferred embodiment, taken in conjunction with the accompanying drawing, in which.

Throughout the figures of the drawing, the same reference numerals are used to denote like features, components or portions of the illustrated apparatus.

DETAILED DESCRIPTION

Figure 1:
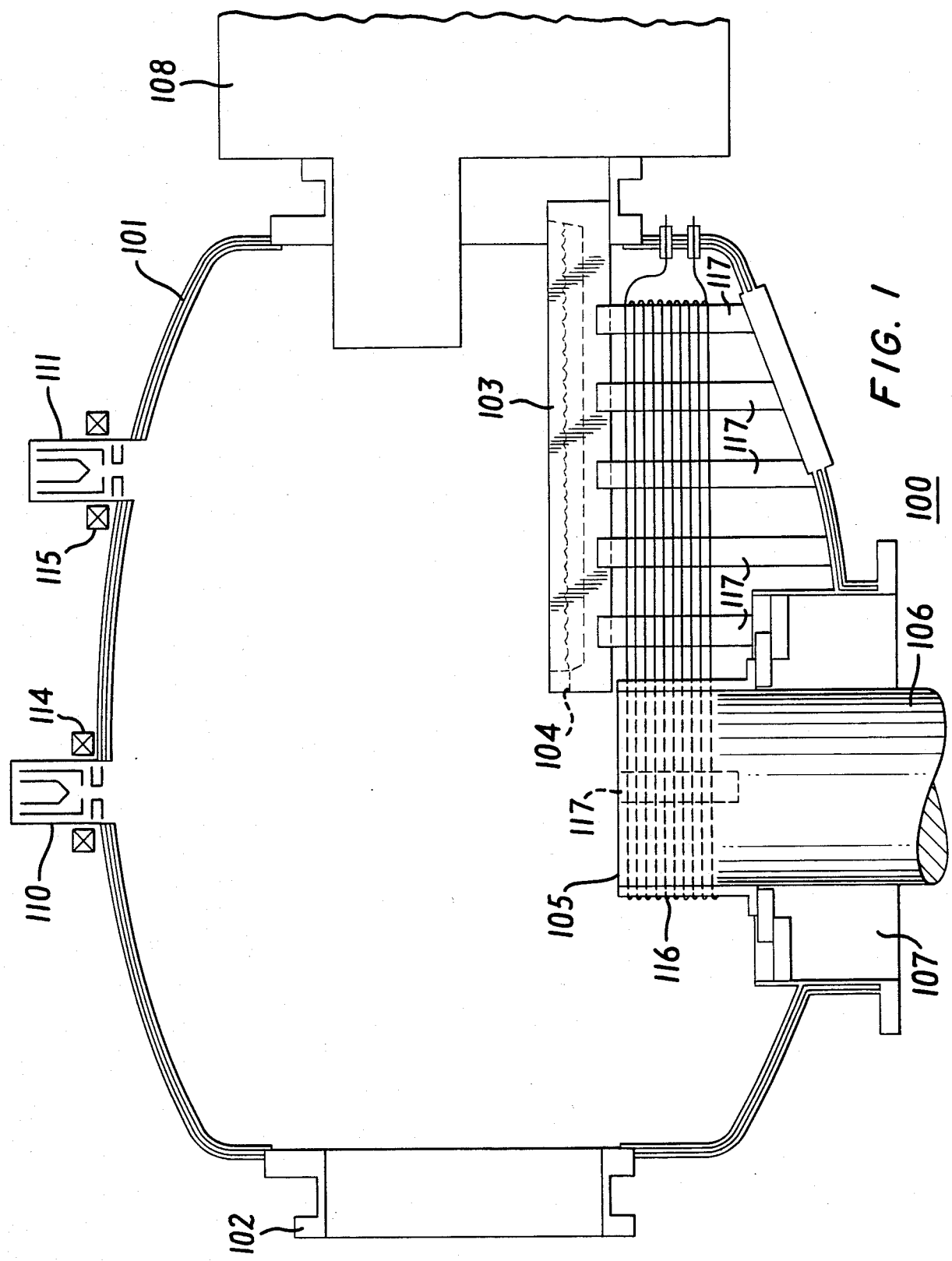
FIG. 1 is a partially-sectional side view of an electron-beam furnace according to the preferred embodiment of the present invention.
Figure 2:
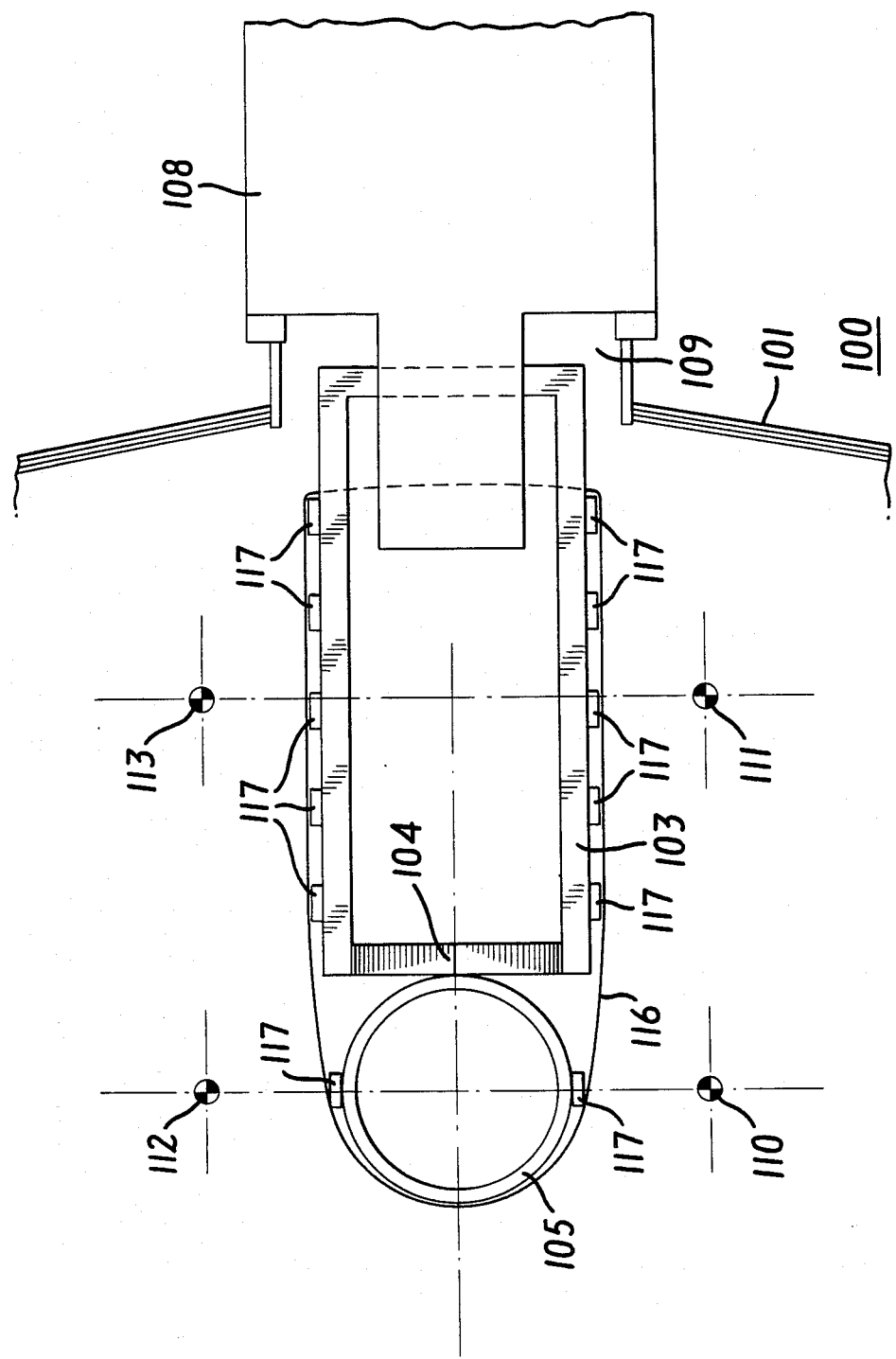
FIG. 2 is a plan view of a portion of the furnace of FIG. 1.
Figure 3:
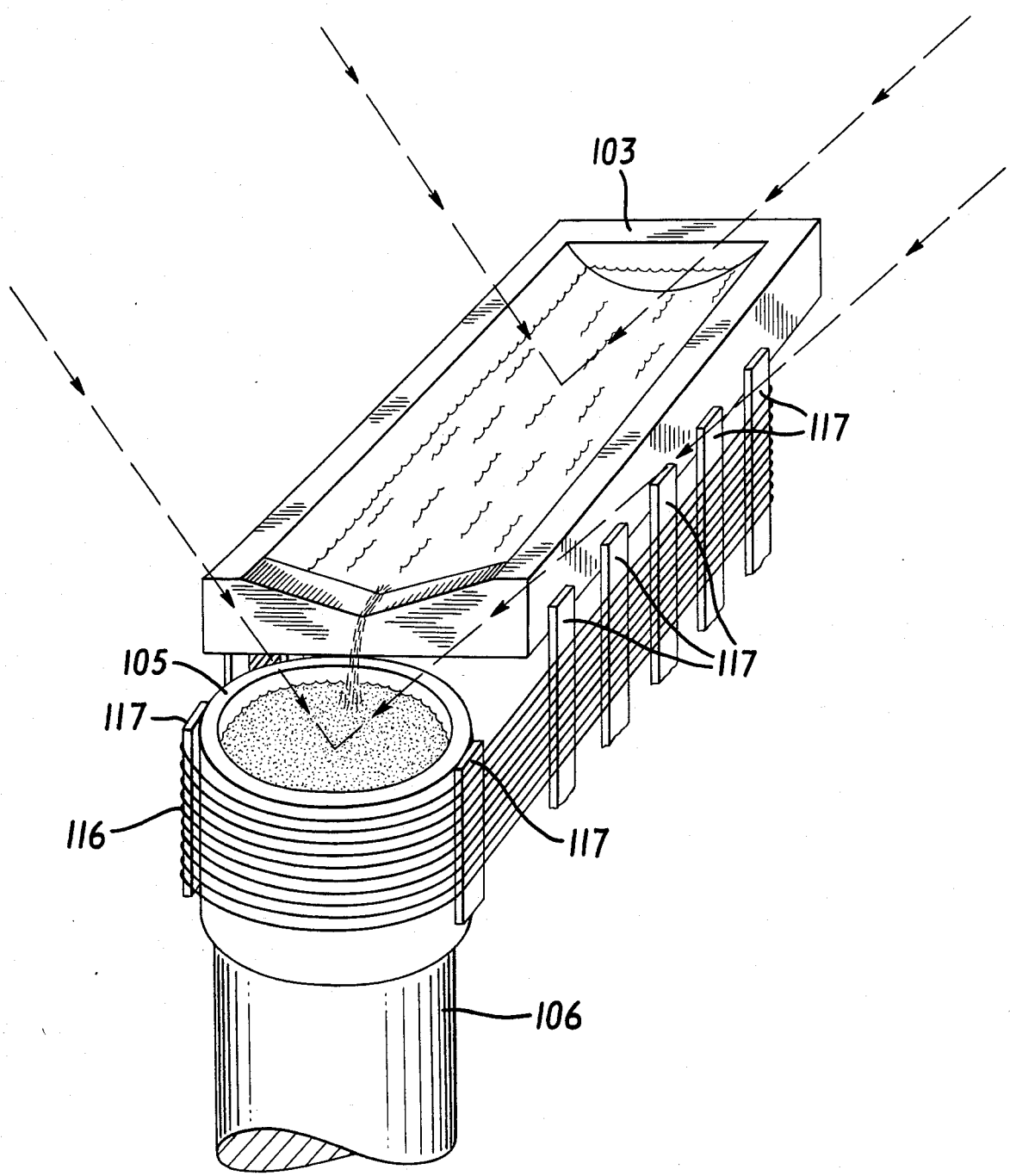
FIG. 3 is an isometric view of the hearth, the crucible, the wire coil and the magnetic shunts of the furnace of FIG. 1.

Referring now to FIGS. 1, 2, and 3, the furnace 100 according to the preferred embodiment of the present invention includes an evacuable chamber 101 having a first flanged port 102 for connecting the chamber to a high vacuum pump, such as a diffusion pump. During operation of the furnace, the pressure in the chamber is advantageously in the range of 0.3 to 30 microns, with the most favorable results being obtained at pressures below 1 micron.

The chamber 101 encloses a rectagular trough-shaped hearth 103, approximately 24 inches wide and 60 inches long. The hearth 103, which is made of copper and water cooled by conventional means (not shown), has a lengthwise cylindrical depression for holding material to be melted and a "V" shaped spout 104 at one end for issuing a flow molten material therefrom, when the depth of the molten material in the hearth reaches approximately 4 inches.

A crucible or mold 105, also made of copper and water cooled by conventional means (not shown), is positioned within the chamber 101 to receive the molten material that issues from the spout 104 of the hearth 103. The molten material in the crucible 105 is solidified into an ingot 106 by cooling. The ingot, thus formed, is progressively drawn from the open bottom of the crucible through a second flanged port 107 of the chamber 101. The crucible is normally an upright cylinder having a desired cross-sectional shape and lateral dimensions up to 25 inches.

Material to be melted is supplied to the hearth by means of a feeder 108 coupled to a third flanged port 109 of the chamber 101. The feeder 108 may be a vibratory feeder for supplying the material in small pieces or a bulk feeder that supplies the material in the form of rods or bars.

Mounted in the upper wall of the chamber 101 are four Von Ardenne Model EH600/40 600 KW electron guns 110, 111, 112 and 113. The positions of the electron guns 110-113 in the upper wall of the chamber 101 are illustrated in FIG. 2. Guns 110 and 112 are both located approximately 70 inches away from the center of the opening of the crucible 105, while guns 111 and 113 are both located approximately 70 inches away from the center of the depression in the hearth 103.

Each of the electron guns 110-113 is provided with an associated magnetic deflection yoke located at the bottom of the gun and forming an integral part of the electron gun assembly. For simplicity of illustration, only the deflection yokes 114 and 115 associated with electron guns 110 and 111, respectively, are depicted in FIG. 1. The deflection yokes, which are of conventional design, steer the electron-beams from their associated electron guns under the control of external currents supplied to the windings of the yokes.

The electron guns 110-113 normally provide relatively narrow beams of approximately ⅜ inch in diameter at a beam energy of approximately 40,000 volts and a beam current of approximately 10 amperes. If desired, the shape of the beams may be altered by the deflection yokes. In the absence of any deflection, electron guns 110 and 112 each provide a beam directed at the center of the crucible opening, while electron guns 111 and 113 each provide a beam directed at the center of the depression in the hearth 103.

During operation of the furnace 100, the beams from the electron guns 110-113 are repeatedly scanned across the hearth 103 and crucible 105 to maintain uniform heating of the material therein. The deflection yokes associated with the electron guns 110-113 are coupled to a beam sweep circuit (not shown), which provides currents to the deflection yokes for controlling the shape and scanning of each beam. Under the control of the beam sweep circuit, each beam traces out a circle, approximately 5 inches in diameter, or an elliptical path of comparable dimensions that can be individually positioned at any one of 20 discrete points distributed over the hearth 103 and crucible 105. The sequence in which each beam is scanned over the discrete points and the dwell time of the beam at each point may be individually programmed by means of the beam sweep circuit. Typically, the beams provided by electron guns 110 and 112 are used to scan the crucible 105, while the beams provided by the electron guns 111 and 113 are used to scan the hearth 103, although any one of the beams may be programmed to scan points in the crucible or the hearth.

As discussed above, when certain materials, such as alumino-thermically reduced columbium or zircaloy-2 are melted in the furnace 100, the electron-beams exhibit a tendency to erratically deviate from their respective targets in the hearth 103 and crucible 105 as steered by the deflection yokes. Such erratic beam behavior makes it difficult to accurately control the scanning of the beams and to maintain temperature uniformity in the hearth and crucible. Moreover, furnace components such as the hearth or crucible may be damaged by such erratic beam behavior.

It has been discovered, however, that the erratic beam behavior is substantially eliminated by the application of a relatively weak magnetic field of between 5 to 50 gauss adjacent to the material in the hearth 103 and the crucible 105. At the beam energies involved, a magnetic field of such strength does not cause significant distortions of the beam trajectories, in that any such distortions are easily corrected at the deflection yokes through the beam sweep circuit. It is believed that the magnetic field serves to stabilize the plasma, which forms in the region immediately above the hearth 103 and the crucible 105, against fluctuations that can cause random deflections of the beams as they pass through the plasma.

The stabilizing magnetic field is advantageously produced by a coil 116 wound around mild steel bars 117 welded to the chamber 101 and positioned partially around the perimeter of the hearth 103 and the crucible 105. The coil 116 consists of ten turns of welding cable that surrounds the crucible and a region directly beneath the hearth. The mild steel bars serve as magnetic shunts 117 that concentrate the magnetic field in the vicinity of the hearth 103 and crucible 105.

The coil 116 is connected to electrical feedthroughs 118 in the walls of the chamber 101. During operation of the furnace 100, the coil 116 is driven by a welding power supply (not shown), at direct currents in the range of 50 to 100 amperes. It was found that for currents in that range, erratic beam behavior is substantially eliminated, while the distortions of the beam trajectories are small enough to be easily correctable and the beams are readily scanned across the hearth 103 and the crucible 105 by the deflection yokes associated with the electron guns.

It is noted that the stabilizing magnetic field may have any orientation with respect to the hearth 103, and the crucible 105. However, it is advantageous to use the field orientation of the disclosed embodiment, since with that orientation, the distortions of the beam trajectories are minimal.

It will be understood that the above and other modifications or alterations may be made to the disclosed embodiment by one skilled in the art without departing from the spirit or scope of the present invention as defined in the appended claims. For example, the stabilizing magnetic field may be provided by means other than a coil, such as one or more permanent magnets.

We claim:

1. An electron-beam furnace comprising:
   a. An evacuable chamber having a port for coupling the chamber to vacuum pump means;
   b. a trough-shaped hearth within the chamber for holding material to be melted, the hearth having a spout for issuing a flow of molten material therefrom;
   c. a crucible positioned within the chamber for receiving molten material flowing from the hearth;
   d. one or more electron guns each for producing an energetic beam of electrons, each electron gun being positioned a relatively large distance away from the hearth and the crucible;
   e. magnetic beam deflection means forming an integral part of each electron gun for scanning and shaping the beam produced thereby across the hearth or the crucible; and
   f. magnetic means adjacent to the hearth and the crucible for producing a relatively weak magnetic field in the vicinity of the hearth and the crucible for preventing erratic deflections of the scanning electron beams without significantly altering the trajectories of such beams.

2. An electron-beam furnace according to claim 1 wherein the strength of the magnetic field produced by the magnetic means is in the range of 5 to 50 gauss.

3. An electron-beam furnace according to claim 2 wherein the magnetic means includes a wire coil surrounding the crucible and a region directly beneath the hearth.

4. An electron-beam furnace according to claim 3 wherein the wire coil is wound around magnetic shunt means.

5. An electron-beam furnace according to claim 4 wherein the magnetic shunt means comprises a plurality of mild steel members that at least partially surrounds the hearth and crucible.

* * * * *

UNITED STATES PATENT AND TRADEMARK OFFICE
CERTIFICATE OF CORRECTION

PATENT NO. : 4,616,363

DATED : October 7, 1986

INVENTOR(S) : Howard R. Harker et al.

It is certified that error appears in the above-identified patent and that said Letters Patent is hereby corrected as shown below:

Col. 2, line 60, after "system" insert--for scanning a relatively narrow, high-intensity electron--

Signed and Sealed this

Twenty-seventh Day of January, 1987

Attest:

DONALD J. QUIGG

Attesting Officer      Commissioner of Patents and Trademarks